United States Patent
Reid

(10) Patent No.: US 6,653,226 B1
(45) Date of Patent: Nov. 25, 2003

(54) METHOD FOR ELECTROCHEMICAL PLANARIZATION OF METAL SURFACES

(75) Inventor: Jonathan David Reid, Sherwood, OR (US)

(73) Assignee: Novellus Systems, Inc., San Jose, CA (US)

( * ) Notice: Subject to any disclaimer, the term of this patent is extended or adjusted under 35 U.S.C. 154(b) by 55 days.

(21) Appl. No.: 09/758,307

(22) Filed: Jan. 9, 2001

(51) Int. Cl.⁷ .................. H01L 21/4763; H01L 21/44

(52) U.S. Cl. .................. 438/631; 438/675; 438/751

(58) Field of Search ................... 438/626, 631, 438/675, 757

(56) References Cited

U.S. PATENT DOCUMENTS

| | | | |
|---|---|---|---|
| 3,849,270 A | | 11/1974 | Takagi et al. |
| 5,034,753 A | * | 7/1991 | Weber ............... 343/846 |
| 5,096,550 A | | 3/1992 | Mayer et al. |
| 5,203,955 A | | 4/1993 | Viehbeck et al. |
| 5,256,565 A | * | 10/1993 | Bernhardt et al. ...... 437/228 |
| 5,486,234 A | | 1/1996 | Contolini et al. |
| 5,557,027 A | * | 9/1996 | Kemp ............... 585/527 |
| 5,843,296 A | * | 12/1998 | Greenspan ............ 205/68 |
| 6,056,864 A | | 5/2000 | Cheung ............... 205/222 |
| 6,056,869 A | * | 5/2000 | Uzoh ................ 205/771 |
| 6,083,835 A | | 7/2000 | Shue et al. ........... 438/687 |
| 6,143,155 A | * | 11/2000 | Adams et al. .......... 205/87 |
| 6,153,521 A | | 11/2000 | Cheung et al. ......... 438/687 |
| 6,171,467 B1 | | 1/2001 | Weihs et al. |
| 6,176,992 B1 | * | 1/2001 | Talieh ............... 205/87 |
| 6,251,235 B1 | | 6/2001 | Talieh et al. |
| 6,315,883 B1 | * | 11/2001 | Mayer et al. .......... 205/123 |
| 6,447,668 B1 | | 9/2002 | Wang |

OTHER PUBLICATIONS

Sato, et al., "Newly Developed Electro–Chemical Polishing Process of Copper as Replacement of CMP Suitable for Damascene Copper Inlaid in Fragile Low–k Dielectrics", Advanced Process R & D Laboratories, LSI Technology Development, Semiconductor Network Company, Sony Corporation, IEDM Meeting, Dec. 2–5, 2001, pp. 1–4.

Tsai, et al., "CMP–Free CMP–Less Approached for Multilevel Cu/low–k BEOL Integration", Taiwan Semiconductor Manufacturing Company, No. 9, IEDM Meeting, Dec. 2–5, 2001, pp. 1–4.

Contolini, et al., "Electrochemical Planarization for Multilevel Metallization", Lawrence Livermore National Laboratory, J. Electrochem Soc., vol. 141, No. 9, Sep. 1994, pp. 2502–2510.

Sato, et al., "Newly Developed Electro–Chemical Polishing Process of Copper as Replacement of CMP Suitable for Damascene Copper Inlaid in Fragile Low–k Dielectrics", Advanced Process R & D Laboratories, LSI Technology Development, Semiconductor Network Company, Sony Corporation, IEDM Meeting, Dec. 2–5, 2001, pp. 1–4.

(List continued on next page.)

Primary Examiner—Amir Zarabian
Assistant Examiner—Pamela E Perkins
(74) Attorney, Agent, or Firm—Beyer Weaver & Thomas, LLP

(57) ABSTRACT

Methods and apparatus are used for electrochemical planarization of an electrically conductive material surface with varying topography from a partially fabricated integrated circuit, in which protruding regions of the conductive material are removed more quickly than recessed regions to thereby increase the planarity of the conductive material surface. This is accomplished by using dissolution electrochemistry. The partially fabricated integrated circuit is used as the anode in an electrochemical cell, with the anode and cathode active surfaces positioned in very close proximity. By using highly resistive electrolyte and moving the anode and cathode progressively closer during electrochemical dissolution, the electrically conductive material surface is effectively planarized.

28 Claims, 6 Drawing Sheets

OTHER PUBLICATIONS

Tsai, et al., "CMP–Free CMP–Less Approached for Multi-level Cu/low–k BEOL Integration", Taiwan Semiconductor Manufacturing Company, No. 9, IEDM Meeting, Dec. 2–5, 2001, pp. 1–4.

Mayer, et al., "Method and Apparatus for Uniform Electropolishing of Damascene IC Structures by Selective Agitation", Novellus Systems, Inc., Application No. 09/967,075, Filed Sep. 28, 2001, pp. 1–50.

* cited by examiner

METHOD FOR ELECTROCHEMICAL PLANARIZATION OF METAL SURFACES

FIELD OF THE INVENTION

This invention relates to surface planarization technology. More specifically, it relates to electroplanarization technology for planarizing surfaces having low aspect ratio recesses or trenches. Even more specifically, the invention pertains to electrochemical planarization of copper or other metals deposited on partially fabricated integrated circuits.

BACKGROUND OF THE INVENTION

In the fabrication of integrated circuits, as the number of levels in an interconnect technology is increased, the stacking of additional layers on top of one another produces a more and more rugged topography. Without planarization, the microscopic canyons that result on the integrated circuit surface from stacking of device features create a topography that would eventually lead to defects in the integrated circuit that would make the circuit unusable.

One method of planarization used in the art is chemical mechanical polishing (CMP). CMP is a process that uses a mixture of abrasives and pads to polish the surface of the integrated circuit. Unfortunately, CMP polishing techniques are difficult to control; the end-point can be difficult to detect. They are also expensive. The high equipment and waste handling cost and low throughput contribute the overall expense of CMP.

Another method of planarization involves an electrolytic technique known as electropolishing. Electropolishing is a low cost alternative technique to CMP. Lower capital cost, easier waste handling, and much higher processing rates make it a desirable alternative to CMP. Electropolishing is a method of polishing metal surfaces by applying an electric current through an electrolytic bath, as described for example in McGraw-Hill Encyclopedia of Science & Technology, pp. 810–811, 1982. The process may be viewed as the reverse of electroplating.

Various US patents describe such electropolishing during IC fabrication. Examples include U.S. Pat. No. 5,096,550 to Mayer et al. ('550 patent), U.S. Pat. No. 3,849,270 to Takagi et al., and U.S. Pat. No. 5,256,565 to Bernhardt et al. Each of these patents is incorporated herein by reference for all purposes.

A problem arises during the electropolishing of surfaces in which low aspect ratio features exist. For example, refer to FIG. 1A and FIG. 1B. FIG. 1A depicts a cross-sectional layer of a partially fabricated integrated circuit 101 in which trenches have been cut in dielectric layer 103 (for a damascene process), and subsequently filled and covered with deposited metal 105. Once deposited metal 105 is electropolished to the dielectric surface, the metal remaining in the trenches will define conductive lines and contact pads for the integrated circuit. High aspect ratio (larger depth than width) features are characterized by trenches with small widths, 107. These are typically used for conductive lines and vias. Low aspect ratio (larger width than depth) features are characterized by trenches with large widths, 109. These are typically used for contact pads. Today, features that vary in size by two orders of magnitude are typical. A 1 $\mu$m deep feature can have widths of from 0.2 $\mu$m to 100 $\mu$m.

Typically, conformal metalization processes are used to conformally deposit metal 105 onto dielectric 103. Because electroplating is highly isotropic, it can be shown both theoretically and experimentally that high aspect ratio features (i.e. depth to width >3:1) are rapidly filled. Therefore, electroplating is a preferred method of metalization. Typically a metalization thickness of ½ the feature width is needed to close the cleft over high aspect ratio features. Further addition of metal, needed to fill low aspect ratio features, not only closes the cleft over high aspect ratio features, but forms protruding regions 111, relative to field regions 113. When enough metal is deposited to completely fill low aspect ratio features, the fill profile over these features exhibit large recesses 115, nearly equal to the original feature depth. Electroplating is not typically continued to "close" recesses 115 because to do so would require depositing a very thick metal layer, which would be uneconomical to add and later remove using conventional CMP or electropolishing technology.

Conventional electropolishing techniques can planarize a surface in which the feature to be planarized is no more than perhaps three times as wide as it is deep. For features wider than these, the rate of removal is essentially uniform everywhere. FIG. 1B depicts a cross-sectional layer of partially fabricated integrated circuit 101 after conventional electropolishing. As seen in FIG. 1B, although protruding regions 111 and field regions 113 of metal 105 are electropolished effectively to the dielectric surface level over the high aspect ratio features; recesses 115 are propagated and expanded to produce recesses 117. Recesses 117 span the width of low aspect ratio features leaving effectively no metal in the pad regions. Obviously, this is an unacceptable result.

The current state of electropolishing technology has additional difficulties. For example, electropolishing typically requires highly viscous electrolyte baths (e.g., 85% phosphoric acid ($H_3PO_4$) in water, or with some added ethylene glycol). While these baths are effective in achieving good polishing and planarization rates, they make it difficult to remove defect-causing bubbles and to handle the fluids in general. Note that a hydrogen generating reaction may take place at the cathode. The hydrogen can become entrained in the electrolyte, complicating tool design and presenting a potential safety hazard. In addition, these baths also have high resistivities, making for large power requirements and substantial amounts of generated heat (which must be removed to maintain a constant process control).

What is needed therefore is improved technology for planarizing conductive layers on integrated circuits and other substrates.

SUMMARY OF THE INVENTION

The present invention provides methods and apparatus for electrochemical planarization of an electrically conductive material surface with varying topography from a partially fabricated integrated circuit, in which protruding regions of the conductive material are removed more quickly than recessed regions to thereby increase the planarity of the conductive material surface.

The invention accomplishes this by providing a cell in which variations in the topology of a wafer surface correspond to significant variations in the resistance of electrolyte in the cell. Regions with protruding features have low electrolyte resistance. Regions with recessed features have significantly higher resistance. Hence regions with protruding features are polished significantly faster than regions with recessed features. As the topological variations decrease during electroplanarization, the variations in resistance (and hence planarization rate) also decrease. Cells and methods of this invention attain the significant variations in resistance by maintaining very small separations between the anode (wafer) and the cathode, and by using a highly resistive electrolyte.

Another aspect of this invention pertains to methods of electrochemical planarization of metals such as copper from partially fabricated integrated circuits. These methods may be characterized by the following elements: (a) using the partially fabricated integrated circuit as an anode in an electrochemical cell; (b) positioning the anode's and a cathode's active surfaces in very close proximity, such that their active surfaces are separated only by the electrolyte medium and its constituents; (c) using an essentially continuous flow of highly resistive electrolyte over the active surfaces of the anode and cathode; (d) moving the anode and cathode progressively closer during electrochemical planarization; and (e) controlling the distance between the anode and the cathode within sub-micron scale distances during electrochemical planarization. From herein, the term wafer is meant to describe a partially fabricated integrated circuit and it should be understood that they are used interchangeably in the text and figures.

As mentioned, the invention finds particular use in the context of copper electrochemical planarization where the operation begins with a copper electrofill layer provided on a wafer's active surface. In this application, the goal is to remove the copper at different rates, depending on the distance between the anode surface (the copper) and the cathode. This is accomplished by taking advantage of a phenomenon present when a highly resistive electrolyte is employed in metal dissolution electrochemistry. Use of a highly resistive electrolyte makes all other resistances in the total electrical circuit negligible in comparison and makes it necessary to position the anode and cathode active surfaces in very close proximity (micron-scale) to establish electrical conductance and thus dissolution. Under these conditions of dissolution, a difference in distance through the electrolyte from the copper active surface to the cathode active surface will result in a proportional dissolution rate difference. The copper surfaces nearest the cathode active surface will dissolve at a highly accelerated rate relative to those further away. Again, within a few microns, as the anode and cathode are moved gradually closer, all protruding copper from the anode surface will be removed before any recessed areas. The net effect is a planarization of the copper surface within sub-micron tolerances.

Another aspect of this invention pertains to apparatus for implementing the method of the invention. In certain embodiments the apparatus may be characterized by the following elements: (a) an electrochemical cell, (b) a pumping system for delivering an essentially continuous flow of electrolyte through the electrochemical cell, (c) a positioning element for moving the cathode active surface to within micron-scale tolerances over the active surface of the anode (partially fabricated integrated circuit), (d) a stage for supporting the anode, which allows rotation of the anode about an axis perpendicular to the anode active surface, (e) a power supply having a current source and a current/voltage sensor for delivering current to the electrochemical cell and determining current flow and voltage levels through the electrochemical cell, and (f) an associated logic for controlling and coordinating the movement and positioning of the anode and cathode, power supply function, and electrolyte flow.

An essentially continuous flow of electrolyte is needed because as dissolution of the metal occurs, the resultant metal ions make the electrolyte less resistive. Since the method relies on highly resistive electrolyte, a continuous fresh supply is necessary for effective removal of the metal ions or any metal salt precipitates that might form from the metal ions.

The positioning element can control movement of the cathode with at least about 0.1 microns accuracy. The active surfaces of the cathode and anode are positioned within 0.5 to 2 microns of each other during electrochemical planarization. In case of any minute irregularities in the cathode active surface, the anode is rotated during electrochemical planarization to ensure homogeneity of the dissolution process.

The current/voltage sensor measures current and voltage between wafer and the counter electrode in the electrochemical cell. This allows the associated logic to control current flow and electrode movement in a manner consistent with the invention. An increase in current flow or a voltage decrease are used as indications that the cathode and anode have made direct contact and must be separated. A decrease in current flow or increase in voltage is used as an indication that enough metal has been removed such that the dielectric layer has been reached and electrochemical planarization is complete. Alternatively, a sensor that measures only current may be used to monitor electrochemical planarization via current flow readings alone. The associated logic may be implemented in any suitable manner. Often it will be implemented in computer hardware and associated software for controlling the operation of the computer.

These and other features and advantages of the present invention will be described in more detail below with reference to the associated figures.

BRIEF DESCRIPTION OF THE DRAWINGS

The following detailed description can be more fully understood when considered in conjunction with the drawings in which.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. For example copper electrochemical planarization on partially fabricated integrated circuits is described. The method could be implemented using other metals or substrates. In some descriptions herein, well-known processes, procedures, and components have not been described in detail so as not to unnecessarily obscure aspects of the present invention.

The method of the invention features an electrochemical planarization apparatus used to remove deposited metal from a partially fabricated integrated circuit. Metal is removed until its surface is planar. This is achieved in one of two ways, either the metal is removed until a dielectric layer is reached or until a specified amount of metal is removed, typically at a point prior to reaching the dielectric layer.

Figure 1A:
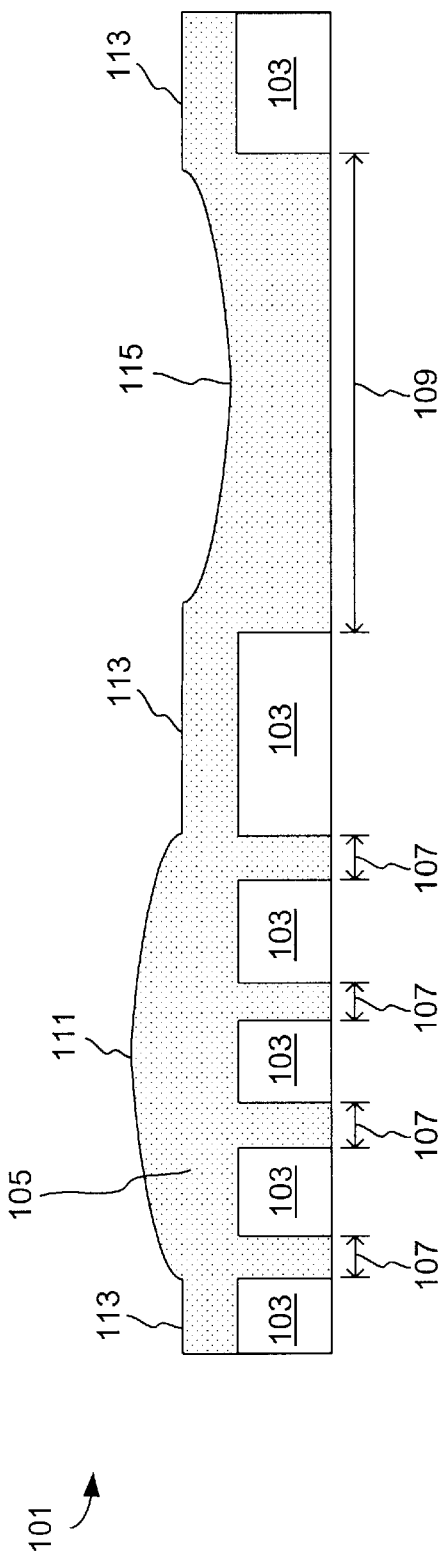
FIG. 1A and FIG. 1B depict cross-sectional views of a partially fabricated integrated circuit, before and after conventional electropolishing.
Figure 1B:
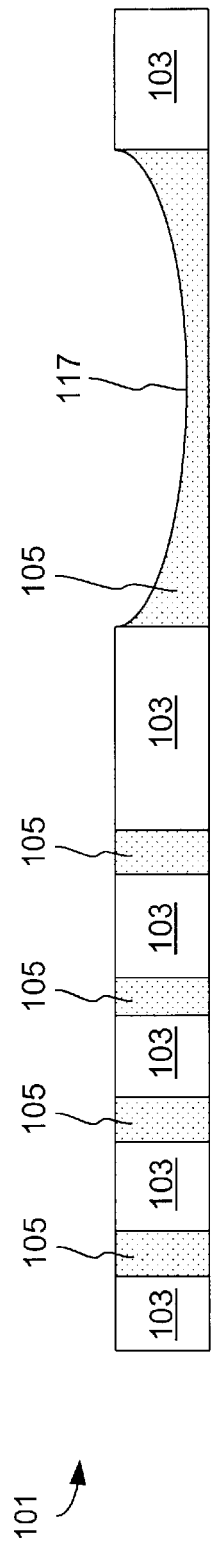
Figure 2:
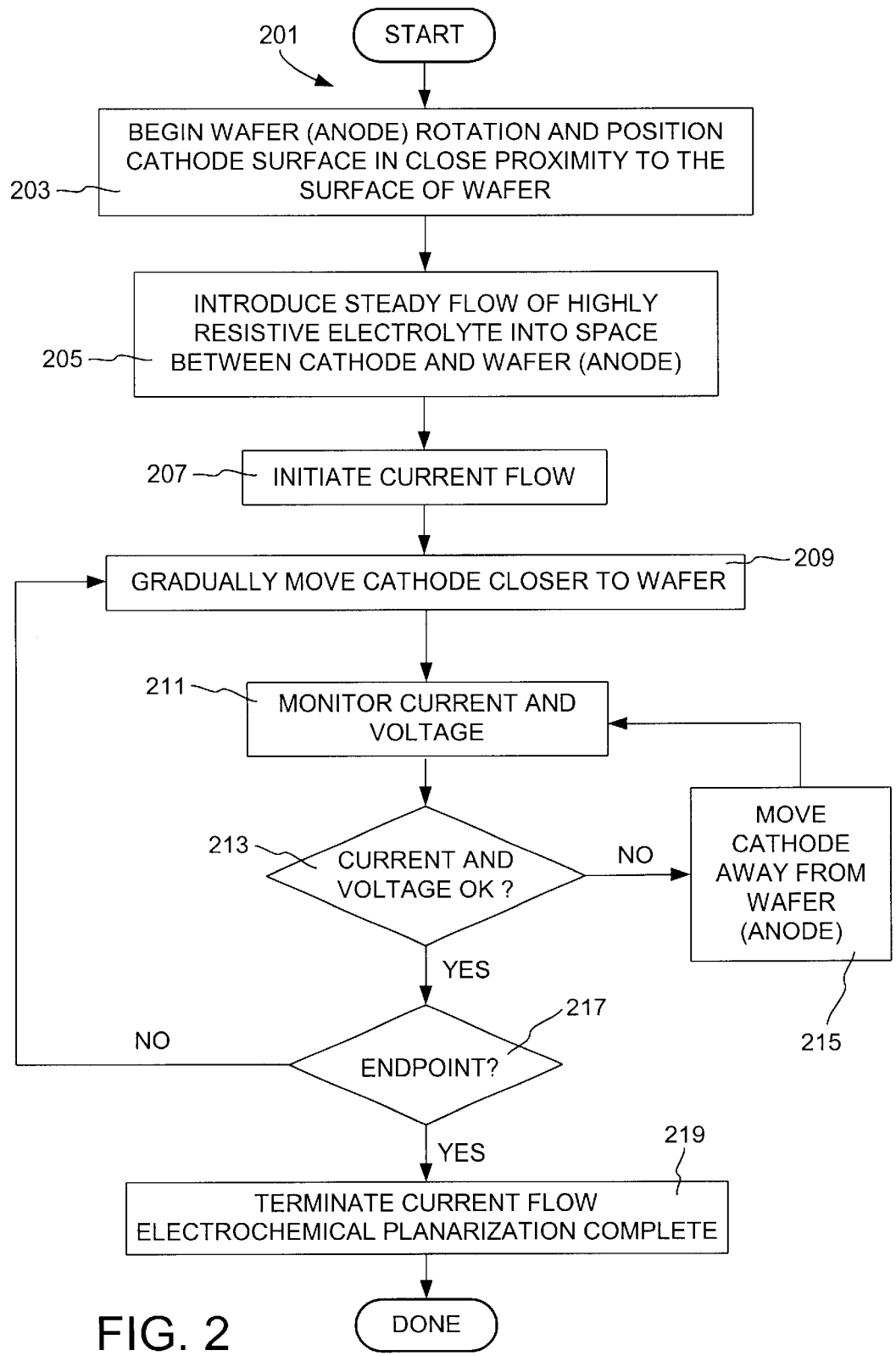
FIG. 2 is a flowchart summarizing the stages of a preferred embodiment of the method.

FIG. 2 summarizes the stages of a preferred method 201 of this invention. First in block 203, rotation of the wafer (anode) is started, and then the cathode active surface is positioned in close proximity to the active surface of the wafer. Typically the distance is between about 0.5 microns and 2 microns. Once the electrodes are in place, a steady flow of highly resistive electrolyte is introduced into the space between the electrodes active surfaces as indicated at block 205. Preferably the electrolyte has a resistance of between about 0.1 to 18 M-ohm-cm. Current flow sufficient to cause dissolution of the metal is initiated in block 207 and then the cathode is moved gradually closer to the wafer. See block 209. Preferably, dissolution occurs at a current between about 2 and 100 mA/cm$^2$. As mentioned, the steady flow of fresh electrolyte is needed to maintain a highly resistive electrolyte local environment. Without this fresh electrolyte to remove and dilute the metal ions produced during dissolution, the electrolyte resistivity would rapidly decrease and thereby reduce the electroplanarization potential. Electrolyte flow may also be required to sweep away bubbles. In some instances, hydrogen gas is produced by the electrolytic reaction. The flow of electrolyte effectively removes any hydrogen formed and thus prevents potentially explosive conditions in the electrochemical cell.

The current and voltage are monitored throughout the electrochemical planarization as indicated at 211. This is important because current flow and voltage levels correspond to the dissolution rate and can be used both as control elements and as endpoint detectors for the method. At block 213, a decision is made based on the current and voltage readings. If the voltage is too low or the current spikes to a high value, indicating that the cathode and anode have made contact (short circuit), the cathode is moved away from the anode to break the contact, 215. Preferably this indication occurs at a voltage less than about 1.5 volts or at a current equal to the maximum current output of the power supply employed. The system then reverts to current/voltage monitoring and evaluation (211, 213). The cathode is moved away from the anode until the current reaches an acceptable level to continue dissolution. If the current and voltage are acceptable at 213, the system checks to see if an endpoint has been reached. See 217. This is typically accomplished by detecting an abrupt current drop or voltage increase, which will occur when the dielectric field is exposed. In condition 217, if the current remains within the specified dissolution range and the voltage is at an acceptable level, then the cathode is gradually moved closer to the anode to continue electrochemical planarization, see 209. This is necessary because metal dissolved during the process causes the separation distances to increase. If the current flow ceases, drops below a level insufficient for further dissolution of metal, or the voltage increases to a level indicative of said insufficient current flow, these events are evaluated as the cathode reaching the field dielectric. The current is shut off and electrochemical planarization is complete, 219.

Figure 3:
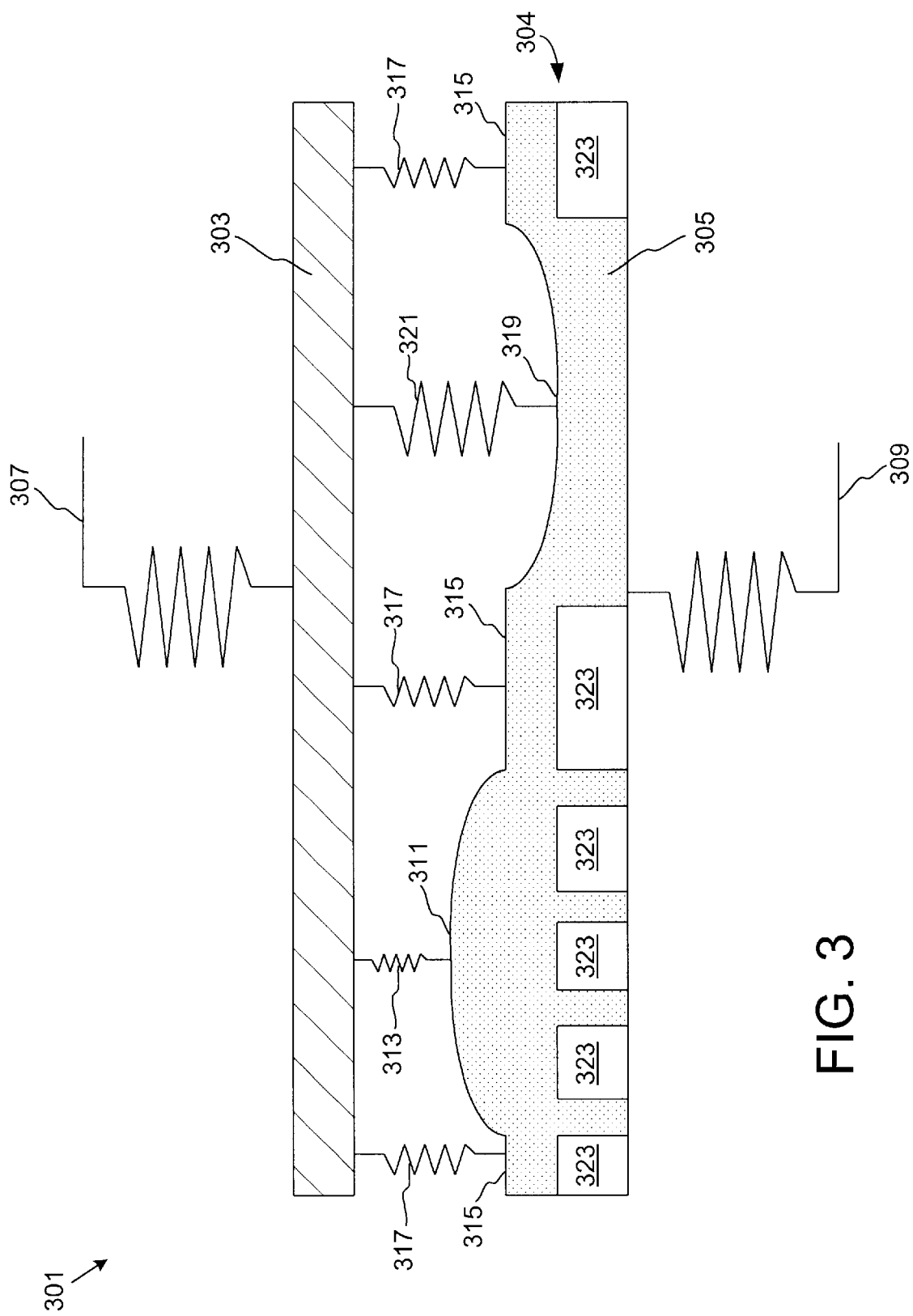
FIG. 3 is a schematic representation of the resistance profile during implementation of the method.

FIG. 3 is a schematic representation of the electrolyte resistance profile 301 during implementation of the method. Again, the combination of a highly resistive electrolyte and close proximity of the anode and cathode to one another allow the electrolyte resistance differences that drive planarization. Through a cathode 303 and an anode 304 (a partially fabricated integrated circuit consisting of dielectric layer 323 and deposited copper layer 305) a current flow is established. As indicated by resistor equivalents 313, 317, and 321 in the electrolyte, a total resistance budget is distributed disproportionately throughout the electrolyte between the cathode and anode active surfaces. As mentioned, the dissolution rate is proportional to the distance between the cathode and anode active surfaces. The electrolyte resistivity and anode-cathode separation distance are chosen so that the resistance differences between protrusions and recesses vary by a significant percentage, (e.g. at least about 50%). The closer the surfaces are the faster the dissolution rate. This is due to the disproportionately high current flowing through these regions. Protruding region 311 of the anode's metal surface is closest to the cathode, so resistance 313 in this region is relatively small and thus dissolution is fast. Field regions 315 are equidistant from the cathode and further from the cathode than region 311, therefore the resistance levels 317 at the field regions are equal to each other but larger than 313. Hence the dissolution rate of these field regions is slower than that of the protruding regions. Recess 319 is furthest from the cathode and thus resistance level 321 in this region is largest and dissolution slowest. Under the conditions defined in the method, this resistance profile (and resultant dissolution profile) exists as long as the topography of the metal varies. It is important that the percent variation in resistance (from protrusion to recess) is maximized. For this reason, it is necessary to keep the anode and cathode as close to one another as possible (without contacting one another). As metal from the anode dissolves, the separation distance increases. Therefore, the control circuitry gradually moves the anode and cathode closer together during the course of electroplanarization. As the cathode is steadily moved toward the anode, the copper is removed disproportionately in accordance with the resistance profile depicted in the FIG. 3. Once the protruding regions are removed and the field level planed to the lowest level of any recesses, the metal surface is effectively planarized.

Figure 4A:
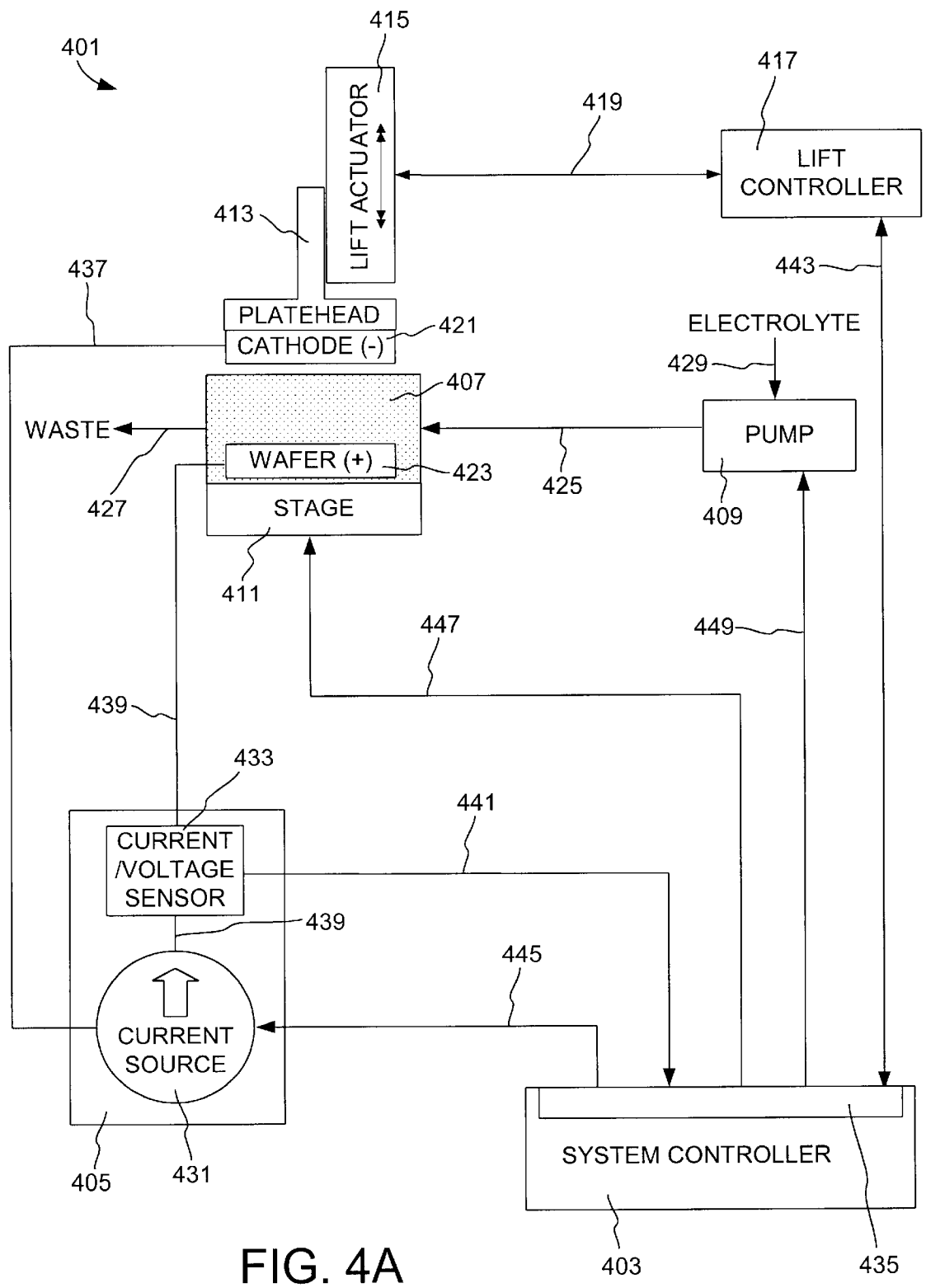
FIG. 4A is a block diagram of an apparatus suitable for implementing the method.

FIG. 4A shows a block diagram of an apparatus 401 for implementation of a preferred embodiment of the method; that is, electrochemical planarization of copper from a partially fabricated integrated circuit. Some individual components of the depicted apparatus can be purchased commercially; although, other components, their configuration, and programming constitute aspects of the invention. Major components of the apparatus are a system controller 403, a power supply 405, an electrochemical processing bath 407, a pump 409, a stage 411; and a system to raise and lower a cathode into the plating bath made up of a platehead 413, a lift actuator 415, and a lift controller 417.

The lift actuator and lift controller communicate via a connection 419. The platehead is raised and lowered by lift actuator 415, which in turn is controlled by lift controller 417. Platehead 413 supports a cathode 421 and immerses it into the plating bath. The lift actuator plate head assembly is capable of precision-scale bi-directional vertical movement of the cathode in the micron-scale range.

An anode 423 (wafer) is submersed in bath 407 for dissolution of its metal surface into the electrolyte. Cathode 421 is typically composed of tantalum, titanium, 304 stainless, 306 stainless, chromium, or other non-depositing metal, so that the metal ions produced from the anode will not be reduced on the cathode. Preferably, though not necessarily, the cathode is dimensionally stable so that separation distance between the anode and cathode facing surfaces is easy to control. Stage 411 rotates anode 423 in bath 407 during the electrochemical planarization.

Pump 409 delivers a continuous flow of electrolyte through the bath via a feed line 425 and an outlet waste line 427. Preferably electrolyte is pumped through the system at a rate between 1 and 25 liters/minute. Fresh electrolyte is delivered into pump 409 via a feed line 429, waste electrolyte is fed to an appropriate waste stream via 427.

System controller 403 coordinates and controls power supply function, electrolyte flow, and electrode position and movement events. In this example, the system controller is an appropriately programmed computer and power supply 405 is a commercially available unit equipped with an internal current source 431 and a current/voltage sensor 433. Alternatively, the power supply could have an internal microprocessor for controlling current and timing events. The logic associated with monitoring current and voltage, maintaining a steady flow of electrolyte, accurately positioning the electrodes in close proximity, and coordinating these events for the purpose of electrochemical planarization is integral to certain embodiments of the invention. System controller 403 has an interface 435 for communication with lift controller 417, pump 409, stage 411, current/voltage sensor 433, and current source 431. Interface 435 has appropriate ports for the communication lines connected to it.

Cathode 421 is connected to power supply 405 via a line 437. Wafer 423 is connected to power supply 405 via a line 439 and is immersed in electroplating bath 407. Current/voltage sensor 433 monitors current and voltage via line 439 and sends signals to system controller 403 via a line 441 (and interface 435). System controller 403 also receives input from lift controller 417 via a line 443 regarding position of the cathode. System controller 403 sends commands to current source 431 via a line 445, stage 411 via a line 447, pump 409 via a line 449, and lift controller 417 via a line 443. Again, interface 435 contains communication ports for lines 445, 441, 447, 449, and 443.

Figure 4B:
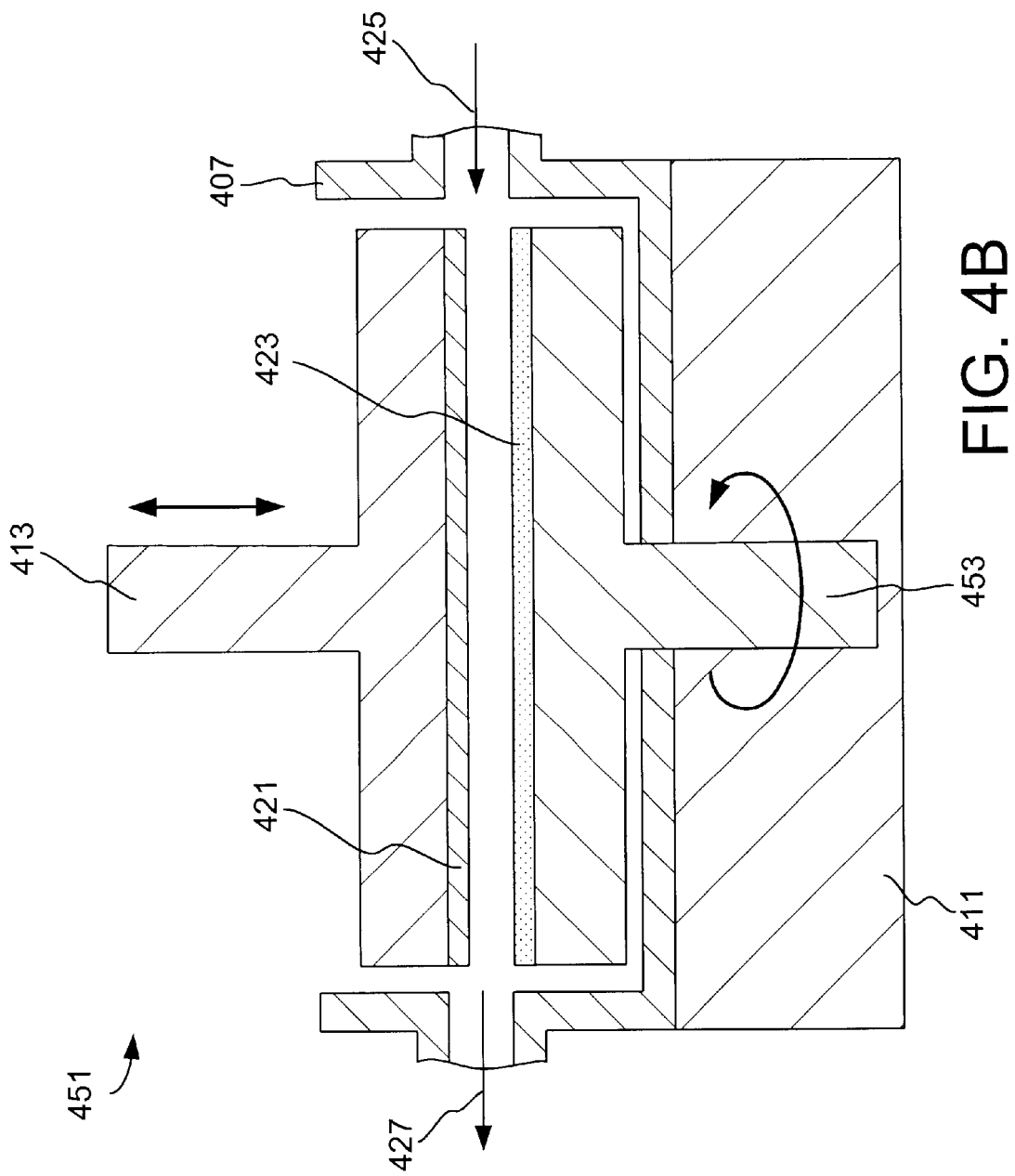
FIG. 4B is a more detailed diagram of a particular assembly of the apparatus.

FIG. 4B is a more detailed diagram of an assembly 451, for bath 407 and stage 411 of apparatus 401, in accordance with a specific embodiment of this invention. Again, bath 407 has feed line 425 and waste line 427 for electrolyte flow through the bath between the anode and cathode. Platehead 413 supports cathode 421 and is moved by the lift actuator (not shown) away from or towards the anode. Stage 411 contains a rotation component 453, which rotates and supports anode 423. In this example, stage 411, rotation component 453, and bath 407 are depicted as an integrated assembly. Alternatively, 453 can be entirely contained within bath 407 and be driven by an internal mechanism. Stage 411 can function not only to rotate wafer 423, but also can be equipped as a heating stage.

For further clarity, a more detailed description of a specific embodiment of the method is provided with reference to FIG. 4A. Typically, the method of the invention would be used during dual damascene processing of a partially fabricated integrated circuit in a step where removal of a copper layer down to a field dielectric was desired. After the wafer is placed into bath 407, system controller 403 turns on stage 411 and commands lift controller 417 to move the cathode into close proximity to the anode via the lift actuator and platehead assembly. Usually the starting position for the cathode and anode surfaces is between about 0.5 and 2 microns apart, more preferably between about 0.5 and 1.0 microns apart. Protruding regions on the wafer will typically be closer, between about 0.2 and 0.5 microns away from the cathode. Then system controller 403 starts pump 409 to initiate a steady flow of electrolyte through bath 407. Again, electrolyte is pumped through the system at a rate between 1 and 25 liters/minute. The electrolyte has a resistance of between about 0.1 and 18 M-ohm-cm, more preferably between about 8 and 18 M-ohm-cm, and most preferably between 12 and 18 M-ohm-cm. Electrolytes which might be suitable for the invention are deionized water, or organic solvents such as acetonitrile, diethylene glycol, propylene glycol, and propylene carbonate. Additives might also be used in conjunction with the electrolyte. One example would be a reducible species for overcharge protection as used in battery technology, such as iron(III) salts or ferrocenes. Also surfactants might be used to improve wetting of the wafer. However care should be taken to ensure that any additives do not increase the electrolyte ionic conductivity to a level that renders the relative differences in resistance insufficient to planarize the wafer surface. Using such a highly resistive electrolyte makes all other resistances in the electrical circuit negligible. Thus the resistance between the cathode and anode through the electrolyte and the corresponding dissolution rate are strongly dependent on the distance between the cathode and the anode. For example, if the cathode surface approaches to within 0.1 microns of the copper surface of the anode, the dissolution rate at that point on the wafer typically will be many times faster than at a point 1 micron away from the cathode surface.

Next, system controller 403 initiates current flow via power supply 405, and then sends commands to the positioning system to gradually move the cathode closer to the wafer. Again, this is done using micron-scale movements. Gradual movement of the cathode toward the anode can be important for maintaining large relative dissolution rate differences between protruding and recessed areas of the wafer surface. Typically, the wafer would start at between about 0.5 and 2 microns above the wafer surface and move toward it by approximately the thickness of the copper layer deposited on the field dielectric, that is between about 0.5 and 3 microns using current technology. The current flow and voltage level are monitored for "spikes." For example if the current flow suddenly rises, resulting from contact of the anode and cathode (a short circuit), then current/voltage sensor 433 sends this data to system controller 403. System controller 403 then commands lift controller 417 to move the cathode away from the anode until contact is broken as indicated by the current returning to its previous dissolution level. If the current flow suddenly drops, resulting from dissolution of metal over the dielectric field regions of the anode, then current/voltage sensor 433 sends this data to system controller 403. In the latter scenario, system controller 403 interprets the current drop to mean that electrochemical planarization is complete. Alternatively, the amount of metal to be removed from the wafer can be calculated based on the total amount of current needed to do so for a particular electrochemical cell and its thermodynamic parameters. There may be instances where the removal of nearly all of the metal is desired, and to remove the remaining 5 to 10% of the metal using CMP would then be economical. In this case, once enough current is applied to remove between about 90 and 95% of the metal, electrochemical planarization is complete. In either scenario once planarization is complete, the system controller turns off the current, raises the cathode to a standby position, stops electrolyte flow, and ceases rotation of the wafer. The wafer is then removed from bath 407 for further processing.

In order to ensure that electrolyte resistance differences drive different dissolution rates between wafer surface protrusions and recesses, the difference in electrolyte resistance between such protrusions and recesses should be at least about 50%, more preferably at least about 75%, and most preferably at least about 90%. To accomplish such differences, the combination of electrolyte conductivity and anode-cathode separation should be optimized. Preferably, the average separation distance between the anode and cathode is on the order of 0.5 and 2 microns, more preferably between about 0.5 and 1.0 microns, and most preferably between about 0.6 and 0.8 microns. As the metal on the anode dissolves, the separation distance will naturally grow. To compensate for this, the control system gradually moves the anode and cathode faces closer together during the course of electroplanarization. The average current passed between the anode and cathode can be a measure of the separation distance, and thus used as a signal for controlling the separation distance. Other techniques for monitoring separation distance may be employed. These include optical and mechanical techniques. Preferably, the electrolyte resistance is between about 0.1 and 18 M-ohm-cm, more preferably between about 8 and 18 M-ohm-cm, and most preferably between about 12 and 18 M-ohm-cm.

While this invention may be practiced with any metal surface that requires planarization, it will find particular usefulness in planarizing metal layers deposited on partially fabricated integrated circuits of semiconductor wafers. Such metal layers may be made of various metals or alloys. Often they will be layers commonly employed as metalization layers in semiconductor devices (e.g. aluminum, copper-aluminum alloys, nobel metals, etc.). In a particularly preferred embodiment, the metal layer to be planarized is a copper metal layer such as an electrodeposited copper metal layer formed during a damascene process.

The invention is typically, though not necessarily, employed to planarize micron-scale variations in surface topology. Such feature variations are typically encountered in integrated circuit fabrication processes. For example, as explained in the "Background" section, damascene processes deposit copper layers over dielectric features that vary in depth by between a fraction of a micrometer and several micrometers (e.g. 0.1 to 10 micrometers).

Again, as will be apparent to those skilled in the art, the present invention may be practiced without these specific details or by using alternate elements or processes. For example, the cathode could be rotated instead of the anode (wafer). Although the cathode was described as being moved toward the wafer, their roles could be reversed or both electrodes could be moved toward each other simultaneously. The rotation component could also have a translational element, providing concurrent "orbiting" and rotating movements. Also, the cathode could be a rod or bar or series of rods or bars (bundled or not), which are passed in close proximity to the wafer surface in any number of movement paths. Alternatively, the cathode could be a porous material through which the electrolyte flows. Any one of the mentioned configurations and analogous designs, would provide efficient mass transfer of the metal ions and support the described dissolution method.

Embodiments of the present invention may employ various processes involving data stored in or transferred through one or more computer systems. Embodiments of the present invention also relate to the apparatus for performing these operations. These apparatus and processes may be employed to control the positions of the anode and cathode, and sometimes control the electrolyte concentration. Concentration may be controlled indirectly by controlling the feed rate of fresh electrolyte and/or the flow rate of electrolyte through the cell. The control apparatus of this invention may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform the required method steps.

In addition, embodiments of the present invention relate to computer readable media or computer program products that include program instructions and/or data (including data structures) for performing various computer-implemented operations. Examples of computer-readable media include, but are not limited to, magnetic media such as hard disks, floppy disks, and magnetic tape; optical media such as CD-ROM disks; magneto-optical media; semiconductor memory devices, and hardware devices that are specially configured to store and perform program instructions, such as read-only memory devices (ROM) and random access memory (RAM). The data and program instructions of this invention may also be embodied on a carrier wave or other transport medium. Examples of program instructions include both machine code, such as produced by a compiler, and files containing higher level code that may be executed by the computer using an interpreter.

Figure 5:
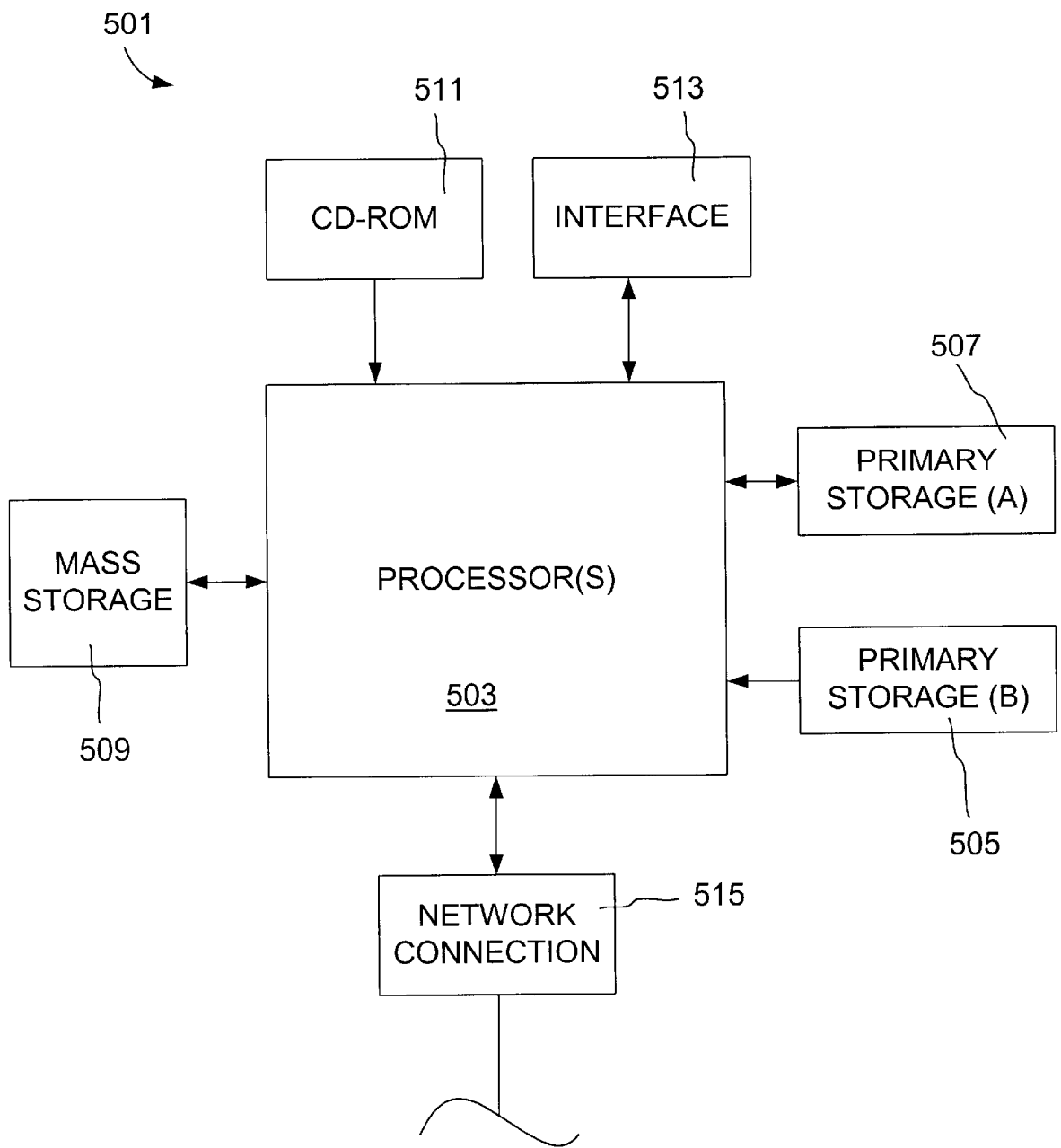
FIG. 5 is a block diagram of a computer system that may be used to implement various aspects of this invention such as coordinating and controlling current flow, electrolyte flow, and electrode positioning.

FIG. 5 illustrates a typical computer system that, when appropriately configured or designed, can serve as a system controller of this invention. The computer system 501 includes any number of processors 503 (also referred to as central processing units, or CPUs) that are coupled to storage devices including primary storage 507 (typically a random access memory, or RAM), primary storage 505 (typically a read only memory, or ROM). CPU 503 may be of various types including microcontrollers and microprocessors such as programmable devices (e.g., CPLDs and FPGAs) and unprogrammable devices such as gate array ASICs or general purpose microprocessors. As is well known in the art, primary storage 505 acts to transfer data and instructions uni-directionally to the CPU and primary storage 507 is used typically to transfer data and instructions in a bi-directional manner. Both of these primary storage devices may include any suitable computer-readable media such as those described above. A mass storage device 509 is also coupled bi-directionally to CPU 503 and provides additional data storage capacity and may include any of the computer-readable media described above. Mass storage device 509 may be used to store programs, data and the like and is typically a secondary storage medium such as a hard disk. It will be appreciated that the information retained within the mass storage device 509, may, in appropriate cases, be incorporated in standard fashion as part of primary storage 507 as virtual memory. A specific mass storage device such as a CD-ROM 511 may also pass data uni-directionally to the CPU.

CPU 503 is also coupled to an interface 513 that connects to one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 503 optionally may be coupled to an external device such as a database or a computer or telecommunications network using an external connection as shown generally at 515. With such a connection, it is contemplated that the CPU might receive information from the network, or might output information to the network in the course of performing the method steps described herein.

Typically, the computer system 501 is directly coupled to a power supply and other components of an electrochemical planarization apparatus of this invention. Data from current and voltage sensors is provided via interface 513 for analysis by system 501. With this data, the apparatus 501 can issue various control commands such as initiating and adjusting current flow or positioning the cathode.

While this invention has been described in terms of a few preferred embodiments, it should not be limited to the specifics presented above. Many variations on the above-described preferred embodiments may be employed. Therefore, the invention should be broadly interpreted with reference to the following claims.

What is claimed is:

1. A method of electroplanarizing a metal layer on a semiconductor substrate, which metal layer has topological variations that are reduced during electroplanarization, the method comprising:

positioning the semiconductor substrate in a cell having an electrolyte and a substantially flat counter electrode, wherein the metal layer faces the counter electrode and is separate from it by a distance at which the resistance across the electrolyte, from substrate to counter electrode, varies by at least about 50% over the topological variations of the metal layer; and applying a potential between the semiconductor substrate and the counter electrode to thereby cause electrolyte dissolution of the metal layer in a manner that planarizes the metal layer.

2. The method of claim 1, wherein the metal layer faces the counter electrode and is separate from it by a distance at which the resistance across the electrolyte, from substrate to counter electrode, varies by at least about 75% over the topological variations of the metal layer.

3. The method of claim 1, wherein the metal layer faces the counter electrode and is separate from it by a distance at which the resistance across the electrolyte, from substrate to counter electrode, varies by at least about 90% over the topological variations of the metal layer.

4. The method of claim 1, wherein the electrolyte has a resistance of at least about 0.1 M-ohm-cm.

5. The method of claim 1, wherein the semiconductor substrate and the counter electrode are separated by an average distance of at most about 2 micrometers.

6. The method of claim 1, further comprising monitoring separation distance between the semiconductor substrate and the counter electrode during the electrolytic dissolution.

7. The method of claim 6, further comprising adjusting the relative positions of the semiconductor substrate and the counter electrode to maintain a separation distance of no more than a predefined distance.

8. The method of claim 1, further comprising flowing electrolyte through the cell during the electrolytic dissolution.

9. The method of claim 1, wherein the metal layer is a copper metal layer.

10. The method of claim 1, wherein the electrolyte resistance is between about 0.1 and 18 M-ohm-cm.

11. The method of claim 1, wherein the electrolyte resistance is between about 8 and 18 M-ohm-cm.

12. The method of claim 1, wherein the electrolyte resistance is between about 12 and 18 M-ohm-cm.

13. A method of electrochemical planarization of an electrically conductive material surface with varying topography from a partially fabricated integrated circuit, in which protruding regions of the conductive material undergo dissolution more quickly than recessed regions to thereby increase the planarity of the conductive material surface, the method comprising:

(a) providing an essentially continuous flow of highly resistive electrolyte;

(b) applying an anodic potential to the partially fabricated integrated circuit in an electrochemical cell;

(c) positioning the partially fabricated integrated circuit and a cathode's active surfaces within micron-scale proximity, such that their active surfaces are separated only by the electrolyte medium and its constituents and electrochemical dissolution of the electrically conductive material surface occurs;

(d) moving the partially fabricated integrated circuit and the cathode progressively closer during the electrochemical planarization; and (e) controlling the distance between the partially fabricated integrated circuit and the cathode within micron-scale distances during electrochemical planarization.

14. The method of claim 13, wherein the conductive material surface is composed of copper.

15. The method of claim 13, wherein the electrolyte has a resistance of between about 0.1 and 18 M-ohm-cm.

16. The method of claim 13, wherein the electrolyte has a resistance of between about 8 and 18 M-ohm-cm.

17. The method of claim 13, wherein the electrolyte has a resistance of between about 12 and 18 M-ohm-cm.

18. The method of claim 13, wherein the cathode and partially fabricated integrated circuit active surfaces are controllably positioned parallel planar to each other, separated by between about 0.5 and 2 microns.

19. The method of claim 13, wherein the cathode and partially fabricated integrated circuit active surfaces are controllably positioned parallel planar to each other, separated by between about 0.5 and 1.0 microns.

20. The method of claim 13, wherein the cathode and partially fabricated integrated circuit active surfaces are controllably positioned parallel planar to each other, separated by between about 0.6 and 0.8 microns.

21. The method of claim 13, wherein a current flow required for electrochemical dissolution of the electrically conductive material surface is between about 2 and 100 $mA/cm^2$.

22. The method of claim 18, wherein the distance between the cathode and partially fabricated integrated circuit active surfaces is held essentially constant during electrochemical planarization.

23. The method of claim 13, wherein significant changes in current flow or voltage level are used as an indicators of physical contact between the cathode and anode active surfaces during electrochemical planarization.

24. The method of claim 13, wherein a decrease in voltage to a level less than about 1.5 volts is used as an indicator of physical contact between the cathode and anode active surfaces during electrochemical planarization.

25. The method of claim 13, wherein significant changes in current flow or voltage level are used as an indicators of completion of electrochemical planarization.

26. The method of claim 13, wherein electrochemical planarization is terminated when a dielectric field region is substantially exposed.

27. The method of claim 13, wherein electrochemical planarization is terminated when between about 90% and 95% of the electrically conductive material has been removed.

28. The method of claim 13, wherein the electrolyte is selected from the group consisting of deionized water, acetonitrile, diethylene glycol, propylene glycol, and propylene carbonate.

* * * * *